United States Patent [19]
Cory et al.

[11] Patent Number: 5,227,725
[45] Date of Patent: Jul. 13, 1993

[54] NUCLEAR MAGNETIC RESONANCE IMAGING WITH SHORT GRADIENT PULSES

[75] Inventors: David G. Cory, Billerica, Mass.; Joel B. Miller, Cheverly; Allen N. Garroway, Fort Washington, both of Md.

[73] Assignee: The United States of America as represented by the Secretary of the Navy, Washington, D.C.

[21] Appl. No.: 619,567

[22] Filed: Nov. 29, 1990

[51] Int. Cl.[5] .............................. G01V 3/00
[52] U.S. Cl. ..................... 324/309; 324/307
[58] Field of Search ............. 324/300, 307, 308, 309, 324/310, 311, 312, 313, 314, 315

[56] References Cited

U.S. PATENT DOCUMENTS

| | | | |
|---|---|---|---|
| 4,542,343 | 9/1985 | Brown | 324/307 |
| 4,549,140 | 10/1985 | MacFall | 324/309 |
| 4,710,718 | 12/1987 | Shaka | 324/309 |
| 4,789,832 | 12/1988 | Nagayama | 324/307 |
| 5,001,427 | 3/1991 | Fujiwara | 324/300 |
| 5,045,790 | 9/1991 | Hall et al. | 324/307 |

OTHER PUBLICATIONS

[1]H-Refocused Gradient Imaging of Solids (Article).
An NMR Multiple Pulse Sequence for the Imaging of Solids Using Sinusoidally Driven Magnetic Field Gradients (Article).
NMR Images of Solids (Publication).
Analysis of NMR Self-Diffusion Measurements by a Density Matrix Calculation (Reference).
Diffusion in Rigid Bilayer Membranes, Use of Combined Multiple Pulse and Multiple Pulse Gradient Techniques in Nuclear Magnetic Resonance (Article).
Analysis of Multiple Pulse NMR in Solids (Publication).
Multiple-Pulse NMR Experiments in Solids: An Introduction to Symmetrized Pulse Sequences (Article).
A Simple, Low Power, Multiple Pulse NMR Spectrometer (Article).

*Primary Examiner*—Louis Arana
*Attorney, Agent, or Firm*—Thomas E. McDonnell; Barry A. Edelberg

[57] ABSTRACT

An improved method and apparatus for nuclear magnetic resonance (NMR) imaging are provided by intercalating a magnetic field gradient in the form of short pulses into an NMR line-narrowing sequence. By inserting the short pulses into predetermined windows in the line-narrowing pulse sequence, the resolution of NMR images obtained thereby is increased and image artifacts from homogenous contributions to the natural linewidth are reduced. Furthermore, the short gradient pulses may be intercalated into known multiple pulse sequences or new multiple pulse sequences for specific imaging purposes which allows far more freedom in designing efficient and improved pulse cycles for NMR imaging.

20 Claims, 6 Drawing Sheets

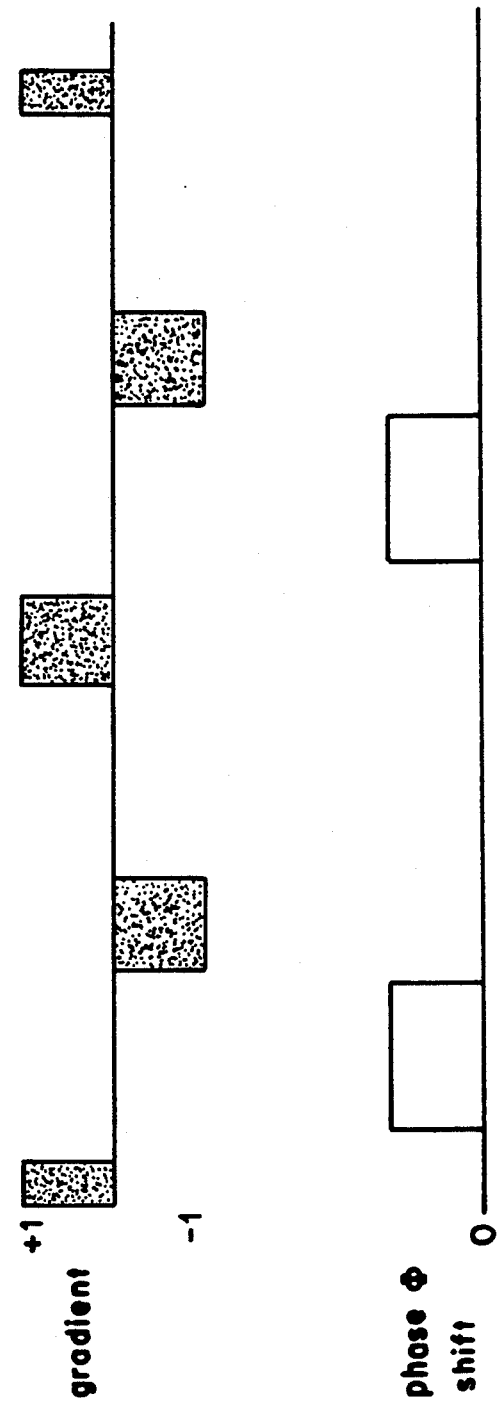
FIG.2A
FIG.2B
FIG.2C

NUCLEAR MAGNETIC RESONANCE IMAGING WITH SHORT GRADIENT PULSES

FIELD OF THE INVENTION

The present invention is directed to a method and apparatus for nuclear magnetic resonance (NMR) imaging and more particularly to the method and apparatus for intercalating a sequence of magnetic field gradient pulses into a line-narrowing sequence in such a manner as to improve the performance of the imaging procedure. These methods and apparatus are illustrated in the context of imaging solids, but may contribute to NMR imaging in general.

BACKGROUND OF THE INVENTION

NMR imaging of solids is being explored as a new method of non-destructive analysis for materials in part because of its capabilities for imaging spatial properties of processed polymers and ceramics. Even though imaging of liquids are well known and widely used, the approaches for liquids do not provide satisfactory images of proton rich rigid solids because of the magnetic dipolar couplings and chemical shifts that broaden the resonances. The resulting broad lines reduce the signal to noise ratio of the image and create excitation and detection bandwidth problems. Because the time necessary to acquire a two-dimensional image is proportional to the natural linewidth of the resonance, and since the ratio of the solid to liquid linewidths is typically greater than 1000, artificially narrowing the resonance of the solid has been suggested for facilitating the recording of high resolution images. A number of line-narrowing techniques such as magic angle spinning and multiple pulse sequences have been applied to NMR imaging. Because of the strong homonuclear dipolar couplings, multiple pulse techniques have shown the most promise for imaging $^1H$ and $^{19}F$ nuclei in rigid solids.

A general characteristic of multiple pulse homonuclear dipolar decoupling sequences is the deterioration of line narrowing as the resonance offset increases. This is a fundamental limitation to using this technique in imaging solids because the range of usable resonance offsets restricts the excitation bandwidth in the imaging process. If the pixel width is sensibly set to the residual linewidth, the restricted offset limits the number of pixels across the field of view. Even when the lines are further narrowed for squeezing more pixels into the usable bandwidth, the total number of pixels may still be insufficient for strongly coupled samples because the strength of the unaveraged dipolar couplings determines both the useable bandwidth and the residual linewidth.

The general method for NMR imaging is well-known. A sample is polarized by a magnet, the nuclear spins are excited and their spatial positions marked by phase or frequency encoding by an applied magnetic field gradient. The NMR signal is then detected and the image is reconstructed. Depending on the details of the application, various of these steps are repeated. But the main, perhaps central, feature of NMR imaging is the use of these magnetic field gradients.

Conventionally, magnetic field gradients have been applied as either time independent fields or as fields which oscillate in time during the data collection in NMR imaging. The most common approach has been to turn a gradient field on, allow the gradient field to stabilize and to subsequently carry out an imaging experiment in a stationary field. The imaging experiment would then typically consist of a multiple pulse line-narrowing sequence such as an MREV-8 sequence, for reducing the line broadening from the homonuclear dipolar coupling of the observed nuclei. In such a method, the resonance shifts due to the gradient are inseparable from chemical shifts which arise from chemically distinct nuclear spins. Thus the presence of a static magnetic field gradient not only decreases the resolution of the resultant image, but also the gradient and chemical shifts cannot be distinguished.

Such a decrease in line-narrowing efficiency of a multiple pulse line-narrowing cycle may originate from the radio frequency (RF) pulses being off resonance, or from phase evolution of the nuclear spins during the intervals between the RF pulses. Earlier, imaging with oscillating gradients had been considered for preventing deterioration arising from the RF pulses being off resonance by minimizing the time during which the gradient and RF fields are simultaneously applied. By applying the RF pulses at the zero crossings of the oscillating gradients, the off resonance effects from the gradient during the RF pulses are reduced. Additionally, it is possible to design line-narrowing sequences which eliminate evolution due to the time independent chemical shift and resonance offset while at the same time retaining evolution due to the gradient since the oscillating gradient amplitude changes periodically. However, the oscillating gradient technique does not prevent the deterioration of line narrowing efficiency with increased gradient strength due to spin evolution between RF pulses. Furthermore, the oscillating gradients are restricted to pulse sequences which have a periodic structure within a pulse cycle that is complementary to the gradient period.

SUMMARY OF THE INVENTION

It is an object of the present invention to provide an improved method and apparatus for NMR imaging.

It is a further object of the present invention to use multiple pulse line-narrowing methods in combination with intercalated short magnetic gradient pulses in order to obtain improved NMR imaging.

The objects of the present invention are fulfilled by providing a method and apparatus for nuclear magnetic resonance imaging comprising a line-narrowing sequence combined with an intercalated series of short magnetic field gradient pulses.

In one embodiment of the present invention, the line-narrowing sequence comprises an MREV-8 sequence and the line-narrowing efficiency of the MREV-8 sequence is improved by the use of intercalated short gradient pulses.

In another embodiment of the present invention, short gradient pulses are inserted into a 48-pulse sequence to obtain solid state NMR images of high quality.

As a result of intercalating short pulses of a magnetic field gradient into a line-narrowing sequence, not only is the interference of the gradient with the line-narrowing sequences reduced but also the gradient shift Hamiltonian and the chemical shift Hamiltonian are no longer by necessity related to each other. This feature is advantageously used in implementing a method of 'second averaging' the chemical shift interaction (a Hamiltonian linear in the spin operator $I_z$) by toggling the phase of the RF excitation pulses while the spin evolution in the pulsed gradients is unaffected by the second averaging. A slice selection method for solids which is based on the well-known DANTE method for selective irradiation of liquids may also be used. The slice selection may be built into the line-narrowing pulse sequence through the use of pulsed gradient and phase toggles. Such approaches may also be extended to volume selection, as required in volume-selected spectroscopy.

Hence, by applying the gradient field as a sequence of short pulses, one achieves a high degree of freedom in designing efficient pulse cycles for imaging, as evidenced in the above examples. These sequences, based on line-narrowing RF sequences intercalated by short gradient pulses, improve resolution and sensitivity in imaging and allows the use of a wide variety of techniques which have been previously precluded because of their sensitivity to the presence of static gradients. While the embodiments of the present invention are directed to solid state imaging, it will be seen that imaging applications to less rigid materials, including liquids, may well profit from the present invention. Although these embodiments of the present invention are directed to specific sequences and applications in solid state imaging, the present invention is not limited to these sequences or applications and various other pulse sequences or applications may be used with other nuclei besides $^1H$ and $^{19}F$ being examined. Accordingly, the embodiments of the present invention provides an improved and efficient method and apparatus for NMR imaging.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention wherein:

FIGS. 2A, 2B and 2C illustrate a phase shifted MREV-8 line-narrowing sequence with short gradient pulses for NMR imaging of solids in one embodiment of the present invention;

FIGS. 6C and 6D illustrate one-dimensional $^1H$ NMR images obtained by the sequence illustrated in FIG. 6A.

DETAILED DESCRIPTION OF THE PRESENT INVENTION

The basic apparatus and techniques of nuclear magnetic resonance (NMR) imaging are well known in the art. Therefore, when a particular apparatus or method is not described in detail, it is to be understood that the apparatus or technique is known to one skilled in the art. Accordingly, the following description will emphasize the new and novel pulsed field gradient NMR imaging and only refer to the conventional NMR imaging techniques and apparatus.

Figure 1:
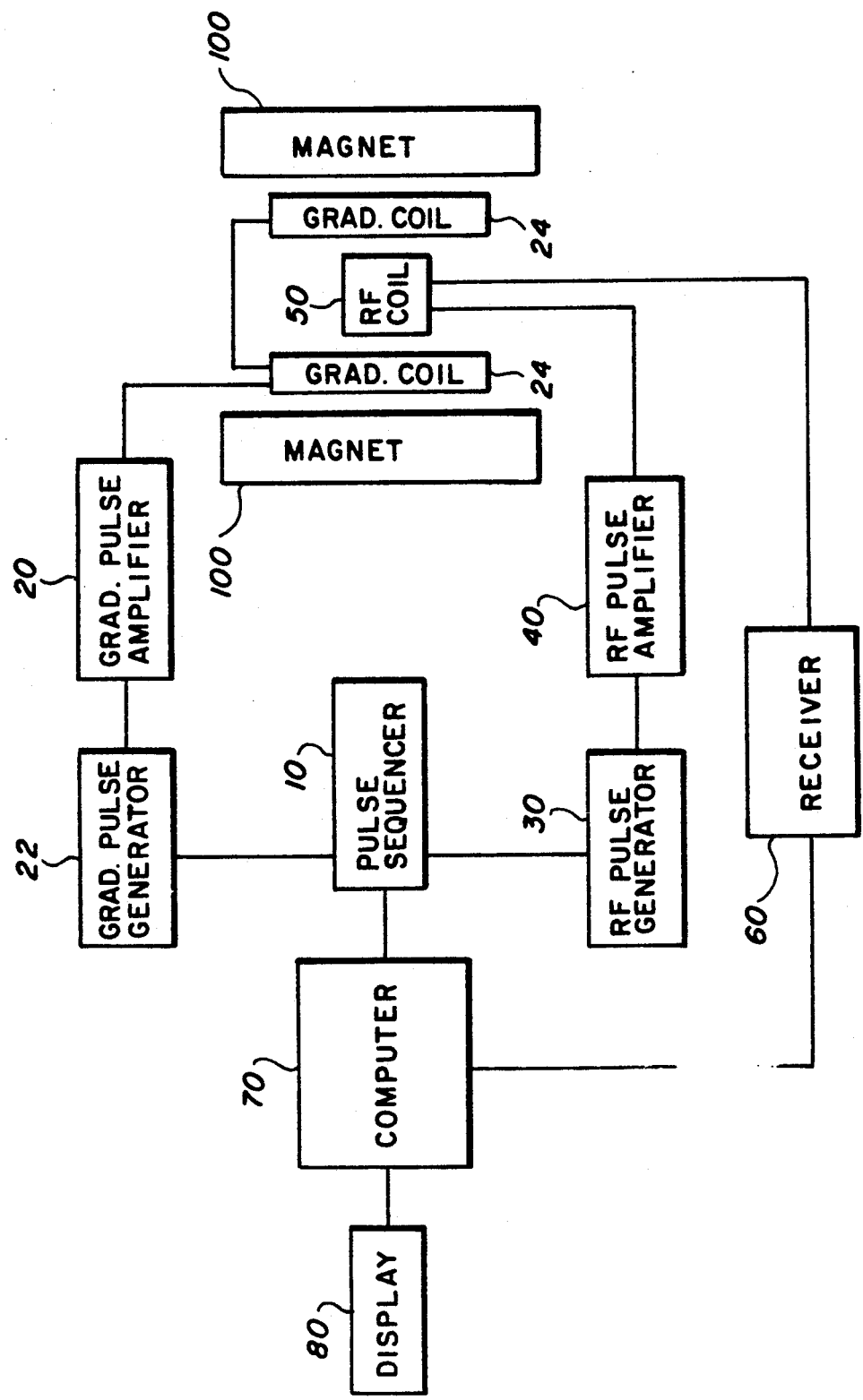
FIG. 1 illustrates an NMR imaging system for an embodiment of the present invention.

FIG. 1 illustrates the system for NMR imaging which includes a pulse sequencer 10 for developing RF pulses and gradient pulses under the control of a computer 70. The gradient pulses are fed to a gradient pulse generator 22 and then to a gradient amplifier 20 and a gradient coil (or coils) 24. The RF pulses are fed to an RF pulse generator 30 which provides phase and frequency modulation as required in the specific application. The RF pulses are then amplified by an RF pulse amplifier 40 and applied to a RF coil 50, in proximity to a sample (not shown) and magnet 100. The NMR signal response from the RF coil 50 is sent to a receiver 60 and, after demodulation, to the computer 70 for image reconstruction and subsequently to a display 80. While FIG. 1, generally illustrates the system for NMR imaging to the present invention, the specialized feature of producing short gradient pulses and the RF line-narrowing sequence will be further described for the embodiments of the present invention.

An embodiment of the present invention is illustrated in FIGS. 2A-2C where an MREV-8 pulse sequence is utilized as the line-narrowing sequence. The MREV-8 sequence is illustrated for example even though various other known pulse sequences may be used. FIG. 2A illustrates the MREV-8 cycle along with the spin operator $I_z$. Spin interactions linear in $I_z$ are oriented along $I_z-I_x$ by the MREV-8 cycle. The MREV-8 cycle includes four solid echo RF pulse pairs. The cycle has "windows" during the intervals of durations $\tau$ and $2\tau$ when the RF pulses are off. The gradient is applied during the long windows (having durations of $2\tau$) in the MREV-8 pulse cycle since the longest possible gradient pulses may then be applied. As a result, the interference of the gradient with the basic solid echo pulse pairs that make up a cycle is avoided. Multiple pulse line narrowing is performed close to resonance where the pulse cycle is effective and a resonance offset is introduced by shifting the phase of RF pulses as illustrated in FIG. 2C. The line-narrowing efficiency of the multiple pulse cycle can be improved by introducing a Hamiltonian orthogonal to the chemical shift Hamiltonian which is along $I_z-I_x$. The chemical shift is then refocused in a "second averaging" frame and no net chemical shift evolution is observed which leads to an improved spatial resolution. However, the gradient need not be averaged by the second averaging process. By applying the gradient pulses in the $2\tau$ windows as illustrated in FIG. 2B, the orientation of the gradient Hamiltonian is directed along $I_z+I_z$, parallel to the second averaging direction.

Line-narrowing sequences, such as MREV-8, are generally associated with $^1$H and $^{19}$F NMR of solids wherein homonuclear dipolar couplings dominate the width of the resonance line. However, other spin interactions such as chemical shifts, magnetic susceptibility, and second order quadrupolar broadening can be removed or reduced as well by line-narrowing sequences. As these spin interactions are not restricted to $^1$H or $^{19}$F nuclei in solids but appear in some fashion in more mobile systems, then NMR imaging of other nuclei in solid or liquid samples may also benefit from the embodiments of the present invention.

Line-narrowing sequences are methods of coherently averaging desired parts of the nuclear interactions by means of RF pulses. Such a line-narrowing sequence might be employed to average homonuclear dipolar couplings and may in addition average inhomogeneous interactions either directly or via a second averaging scheme as previously described. The use of pulsed magnetic field gradients inserted into selected windows when the RF pulses are off in the multiple pulse cycle, rather than conventionally used static gradients, gives an operator far more flexibility in using line-narrowing sequences. Certain new sequences for improving the imaging capabilities are possible and also the line-narrowing efficiency of existing pulse sequences is substantially improved from the embodiments of the present invention.

One reason that the MREV-8 sequence as described above enjoys such popularity is that, although its line-narrowing efficiency deteriorates in the presence of a static magnetic gradient, this deterioration is not as severe as in other sequences. However, the use of pulsed gradients allows other line-narrowing sequences which may have been previously rejected because of such a sensitivity to the static gradient. Accordingly, we have designed and demonstrated a new line-narrowing pulse cycle which includes 48 RF pulses. This cycle reduces residual linewidths by about a factor of 100 compared to the previously used MREV-8 sequence.

Figure 3A:
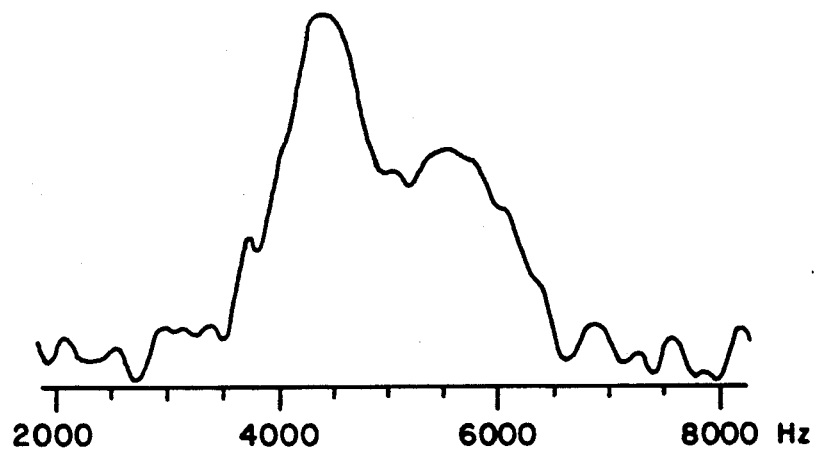
FIG. 3A illustrates a one-dimensional $^1H$ image of a sample obtained with MREV-8 line-narrowing and a static magnetic field gradient.
Figure 3B:
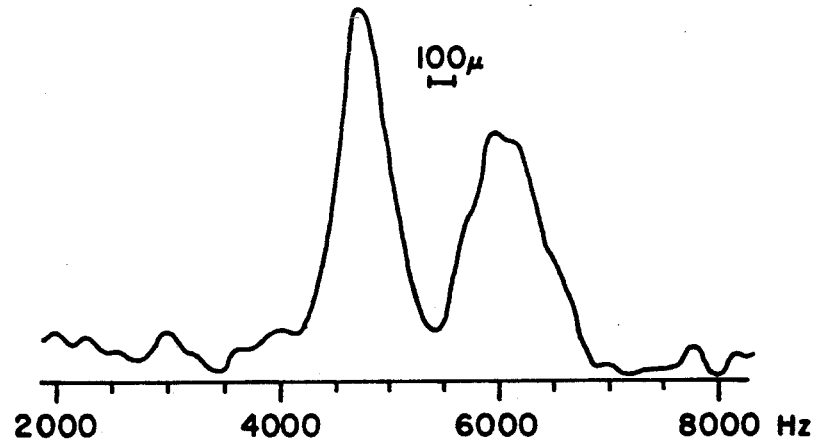
FIG. 3B illustrates the one-dimensional image of the sample obtained with MREV-8 line-narrowing and pulsed field gradients.

FIG. 3A illustrates a one-dimensional $^1$H image of a sample having two rectangular pieces of Mylar film 130 μm thick that is obtained by a conventional MREV-8 line narrowing and static magnetic field gradient technique. FIG. 3A illustrates that the broad line is structured although the two pieces of film are not resolved. FIG. 3B illustrates the one-dimensional $^1$H image of the same sample obtained with a pulsed field gradient technique similar to the above-described embodiment. In contrast to FIG. 3A, the two pieces of Mylar film are clearly resolved in FIG. 3b, indicating the enhanced resolution achieved by means of the pulsed gradient imaging.

Figures 4A, 4B:
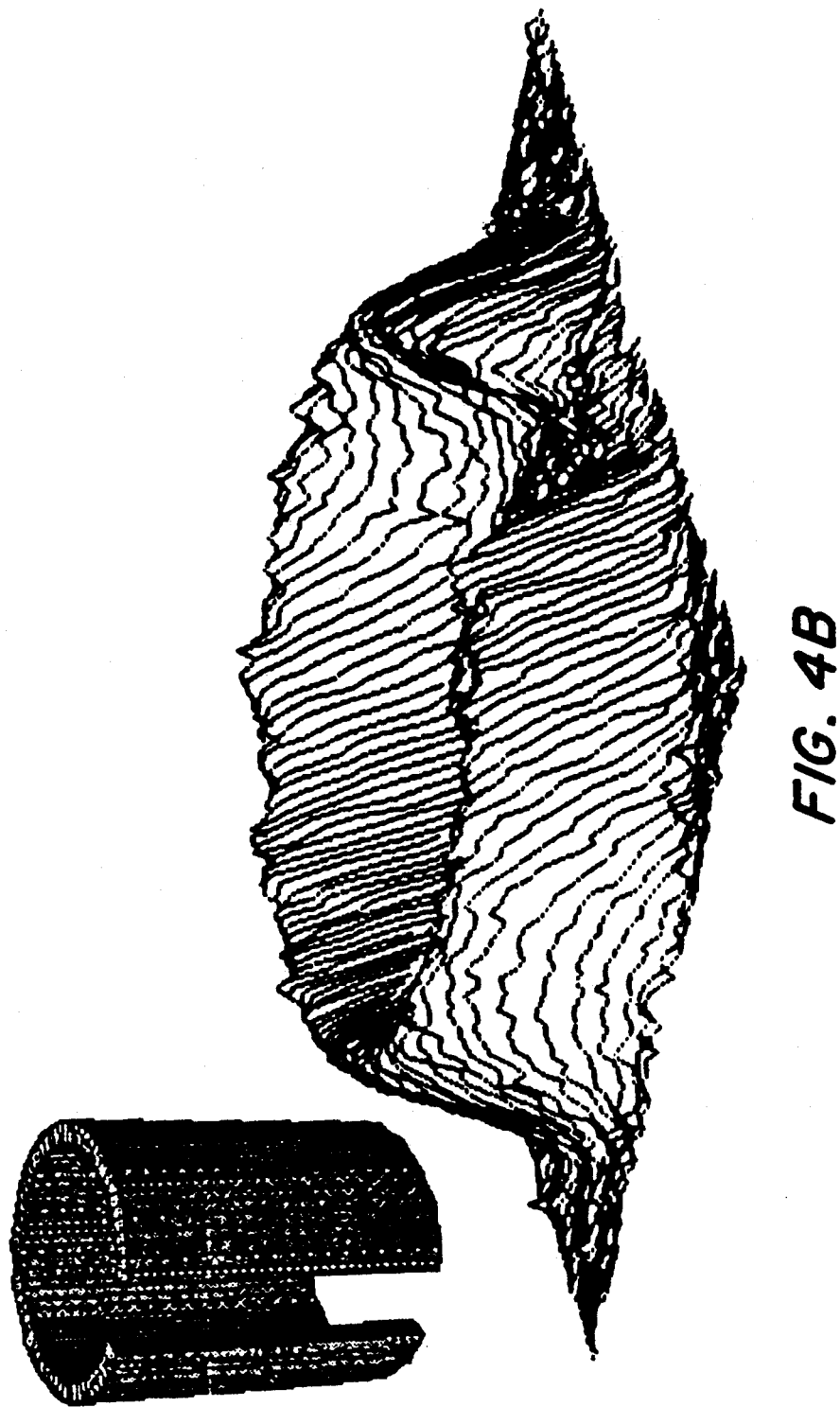
FIGS. 4A and 4B illustrate the geometry of a specimen and its NMR image obtained by the MREV-8 line-narrowing and the pulsed field gradients illustrated in the embodiment illustrated by FIGS. 2A-2C.

FIG. 4A illustrates the geometry of a poly(methyl methacrylate) phantom. This phantom is a right cylinder 6.45 mm in diameter, with a slot removed. FIG. 4B illustrates a stack plot display of the $^1$H NMR image obtained by the above-described embodiment where gradient pulses are inserted into an MREV-8 sequence with a toggle of predetermined RF phases to create a second averaging of extraneous broadening, as in the above-described embodiment. The image acceptably represents the shape of the object and is substantially without distortion.

Figure 5A:
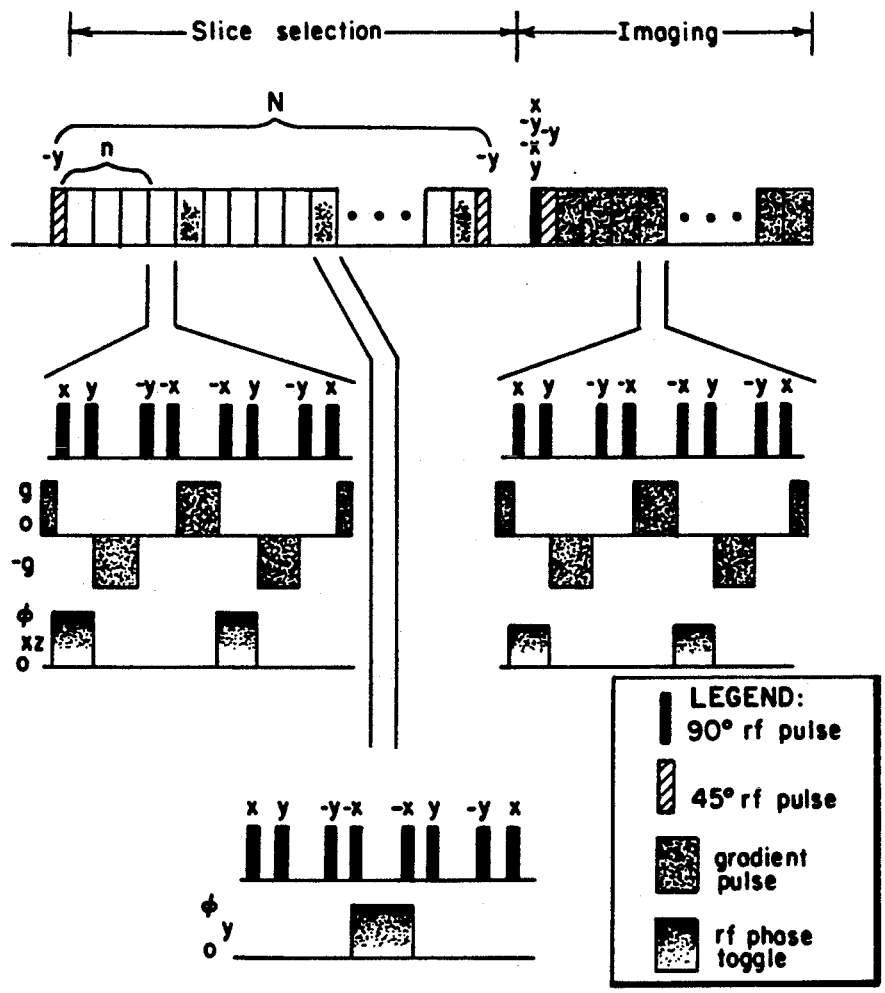
FIG. 5A illustrates a DANTE slice selection and imaging sequence using pulsed gradients and a phase-toggled MREV-8 pulse cycle.
Figure 5B:
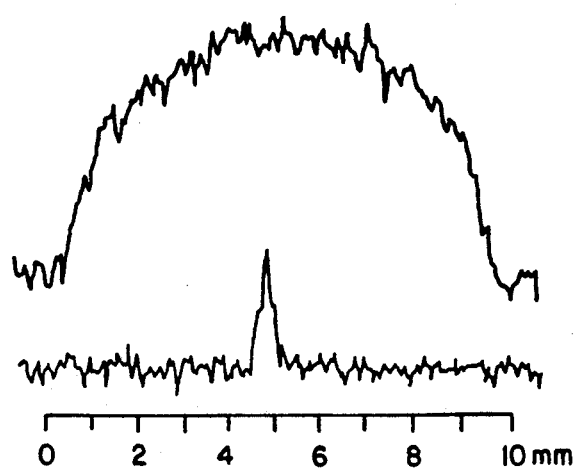
FIG. 5B illustrates the resulting slice (bottom) from a cylinder (top) of ferrocene.

FIG. 5A illustrates a RF pulse and a pulsed gradient sequence for a DANTE-like slice selection followed by a one-dimensional imaging sequence employing a phase toggled MREV-8 second averaging sequence similar to the sequence illustrated in FIGS. 2A–2C. FIG. 5B illustrates a $^1$H NMR profile of a cylindrical phantom of ferrocene (top) and the slice (bottom) obtained by the sequence of FIG. 5A.

Figure 6A:
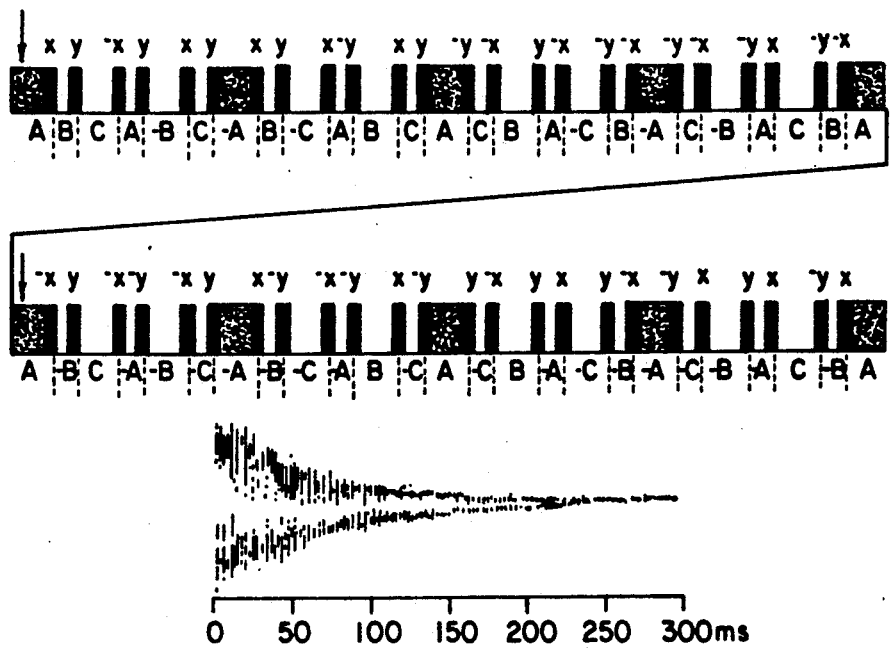
FIG. 6A illustrates a 48-pulse sequence.
Figure 6B:
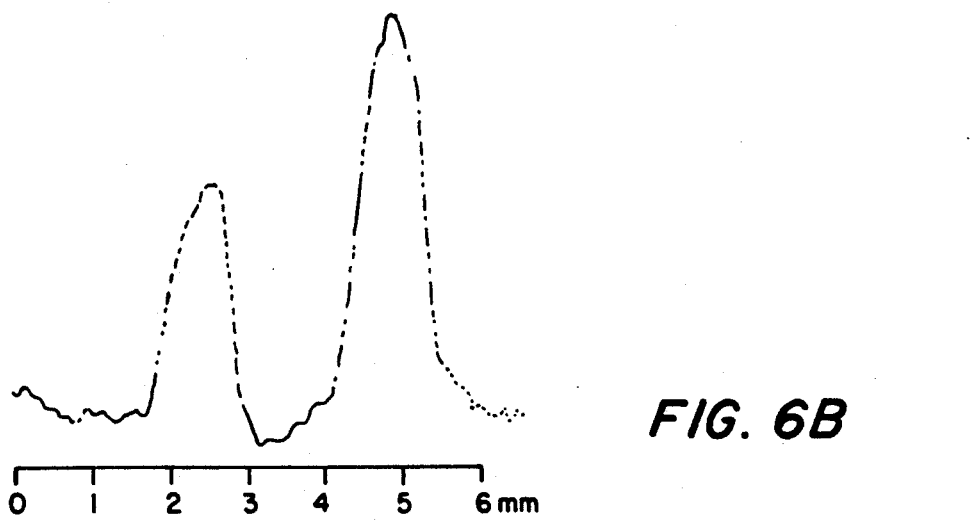
FIG. 6B illustrates a free induction decay signal from a specimen of ferrocene under the 48-pulse sequence illustrated in FIG. 6A.
Figure 6C:
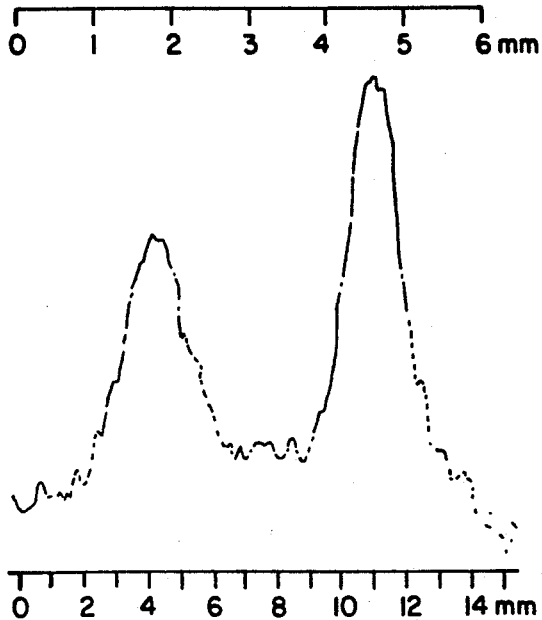

FIG. 6A illustrates a 48-pulse sequence designed to take advantage of intercalated gradient pulses which may be inserted into the windows shaded grey. Phases of the RF pulses are conventionally indicated as x, -x, y, -y and the states of the linear operators of the spin system are conventionally indicated by A, B, and C. A free induction decay signal from a specimen of ferrocene is illustrated in FIG. 6B. The decay time of this curve is almost ten times longer than the comparable decay under a MREV-8 sequence with second averaging of inhomogeneous interactions, as depicted in FIG. 2. Such an increase in decay time provides improved spatial resolution for NMR imaging. FIGS. 6C and 6D illustrate one-dimensional $^1$H NMR images obtained with this 48-pulse sequence for phantoms of ferrocene and pressure-crystallized polyethylene, respectively.

In summary, the magnetic field pulsed gradients described in the embodiments of the present invention encode a spatial location of a spin by a sequence of short pulses which are intercalated into a line-narrowing sequence such that the interference of the gradient with the line narrowing sequence is minimized. With pulsed gradients, both the homonuclear decoupling efficiency and gradient shifts may be preserved. A further consequence of the use of pulses gradients is that the axis about which the spins evolve in the gradient may be selected experimentally without a prior relation to the axis for the chemical shift evolution. A great amount of freedom in designing efficient pulse cycles for imaging is allowed by applying the magnetic field gradient in the form of short gradient pulses since the operator may turn the gradient on or off or in different directions as desired and one is no longer restricted to employ only those line-narrowing sequences which are inherently insensitive to the presence of static magnetic gradients. For example, cycles may be designed where the chemical shift and homonuclear dipolar couplings vanish while gradient evolution is retained.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims.

What is claimed is:

1. A method for imaging an object by nuclear magnetic resonance, comprising the steps of:
    (a) intercalating a sequence of magnetic field gradient pulses into a predetermined number of windows in a RF pulse sequence having at least one window, each of said windows being positioned between each RF pulse of said RF pulse sequence, to form an intercalated pulse sequence;
    (b) exposing said object to said intercalated pulse sequence to excite nuclear spins within said object, thereby phase and frequency encoding spatial positions of said excited nuclear spins;
    (c) detecting NMR signals corresponding to the nuclear procession during said RF pulse sequence;
    (d) repeating said steps (b)–(c) as required for imaging the object; and
    (e) processing said NMR signals as an image of the object.

2. The method of claim 1, wherein said RF pulse sequence comprises a multiple pulse cycle having said at least one window for coherently averaging homonuclear dipolar couplings to zero.

3. The method of claim 1, wherein said RF pulse sequence comprises a multiple pulse cycle having said at least one window for coherently averaging time independent $I_z$ interactions to zero.

4. The method of claim 1, wherein said RF pulse sequence comprises a multiple pulse cycle having said at least one window for coherently averaging homonuclear dipolar couplings and time independent Iz interactions to zero.

5. The method of claim 2, further comprising the step of performing a second averaging interaction for removing time independent $I_z$ interactions.

6. The method of claim 5, wherein said second averaging interaction is performed by applying said magnetic field gradient pulses.

7. The method of claim 5, wherein said second averaging interaction is performed by phase varying said RF pulse sequence.

8. The method of claim 5, wherein said second averaging interaction is performed by amplitude varying said RF pulse sequence.

9. The method of claim 5, wherein said second averaging interacting is performed by varying the lengths of the RF pulses in said RF pulse sequence.

10. The method of claim 5, wherein said second averaging interaction is performed by varying the spacings of the RF pulses in said RF pulse sequence.

11. The method of claim 1, wherein said RF pulse sequence comprises a MREV-8 sequence.

12. The method of claim 1, wherein said RF pulse sequence comprises a 48-pulse sequence.

13. The method of claim 1, wherein said nuclear spins are initially excited at said step (b) by a slice selection.

14. A nuclear magnetic resonance imaging apparatus comprising:
RF pulse developing means for developing a line narrowing RF pulse sequence having at least one window, each of said windows being positioned between each RF pulse of said RF pulse sequence;
magnetic field gradient developing means for developing a sequence of magnetic field gradient pulses;
intercalating means for intercalating said sequence of magnetic field gradient pulses into a predetermined number of said windows in said RF pulse sequence to develop an intercalated pulse sequence;
excitation means for exposing an object to be imaged to said intercalated pulse sequence to excite nuclear spins within said object and thereby phase and frequency encode said nuclear spins;
detecting means for detecting NMR signals corresponding to the nuclear procession during said RF pulse sequence; and
processing means for processing said NMR signals as an image of the object.

15. The apparatus of claim 14, wherein said RF pulse developing means comprises means for developing a RF pulse sequence having a multiple pulse cycle and said at least one window for coherently averaging homonuclear dipolar couplings to zero.

16. The apparatus of claim 14, wherein said RF pulse developing means comprises means for developing a RF pulse sequence having a multiple pulse cycle and said at least one window for coherently averaging time independent $I_z$ interactions to zero.

17. The apparatus of claim 14, wherein said RF pulse sequence developed by said RF pulse developing means comprises a multiple pulse cycle having said at least one window for coherently averaging homonuclear dipolar couplings and time independent $I_z$ interactions to zero.

18. A method for slice selection in nuclear magnetic resonance imaging, comprising the steps of:
(a) intercalating a sequence of magnetic field gradient pulses into a predetermined number of windows in a line narrowing RF pulse sequence having at least one window, each of said windows being positioned between each RF pulse of said RF pulse sequence, to develop an intercalated pulse sequence;
(b) selecting a slice of an object by exposing said object to said intercalated pulse sequence;
(c) imaging said selected slice.

19. The method of claim 18, wherein said RF pulse sequence comprises a multiple pulse cycle having said at least one window for coherently averaging homonuclear dipolar couplings to zero.

20. A method for volume selection in nuclear magnetic resonance imaging, comprising the steps of:
(a) intercalating a sequence of magnetic field gradient pulses into a predetermined number of windows in a line narrowing Rf pulse sequence having at least one window, each of said windows being positioned between each RF pulse of said RF pulse sequence, to develop an intercalated pulse sequence;
selecting a volume of an object by exposing said object to said intercalated pulse sequence;
(c) detecting the nuclear signal from said selected volume.

* * * * *